(12) United States Patent
Katsuki

(10) Patent No.: US 8,487,419 B2
(45) Date of Patent: Jul. 16, 2013

(54) METHOD OF MANUFACTURING SEMICONDUCTOR APPARATUS, THE SEMICONDUCTOR APPARATUS, AND IGNITOR USING THE SEMICONDUCTOR APPARATUS

(75) Inventor: Takashi Katsuki, Nagano (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 13/347,898

(22) Filed: Jan. 11, 2012

(65) Prior Publication Data

US 2012/0175757 A1    Jul. 12, 2012

(30) Foreign Application Priority Data

Jan. 12, 2011  (JP) ................... 2011-003893

(51) Int. Cl.
*H01L 23/495* (2006.01)

(52) U.S. Cl.
USPC ............... 257/676; 257/E21.499; 438/123; 102/202.4

(58) Field of Classification Search
USPC ........... 438/123; 257/676, E21.499, E23.031; 102/202.4, 202.5, 202.7
See application file for complete search history.

(56) References Cited

U.S. PATENT DOCUMENTS

| | | | | |
|---|---|---|---|---|
| 4,976,200 A | * | 12/1990 | Benson et al. ............. | 102/202.7 |
| 5,309,841 A | * | 5/1994 | Hartman et al. ........... | 102/202.4 |
| 5,408,127 A | * | 4/1995 | Mostafazadeh ............... | 257/676 |
| 6,199,484 B1 | * | 3/2001 | Martinez-Tovar et al. | 102/202.4 |
| 6,258,629 B1 | * | 7/2001 | Niones et al. ................. | 438/111 |
| 2003/0160317 A1 | | 8/2003 | Sakamoto et al. | |

FOREIGN PATENT DOCUMENTS

| | | |
|---|---|---|
| JP | 09-082879 A | 3/1997 |
| JP | 2004-119676 A | 4/2004 |
| JP | 2009-129952 A | 6/2009 |

OTHER PUBLICATIONS

European Search Report issued in European counterpart application No. EP11195847.6, dated Jan. 31, 2013.

\* cited by examiner

*Primary Examiner* — Roy Potter
(74) *Attorney, Agent, or Firm* — Rossi, Kimms & McDowell LLP

(57) ABSTRACT

A method of manufacturing a semiconductor apparatus according to aspects of the invention can include the steps of coating solder on an predetermined area in the upper surface of a lead frame, mounting a chip on solder and melting solder with a hot plate for bonding the chip to the lead frame. The method can also include wiring with bonding wires, turning lead frame upside down, placing lead frame turned upside down on heating cradle, coating solder, the melting point of which is lower than the solder melting point and mounting electronic part on solder; and melting solder with heating cradle for bonding electronic part to lead frame. The bonding with solder can be conducted at a high ambient temperature. Aspects of the semiconductor apparatus can facilitate mounting semiconductor devices and electronic parts on both surfaces of a lead frame divided to form wiring circuits without through complicated manufacturing steps.

7 Claims, 3 Drawing Sheets

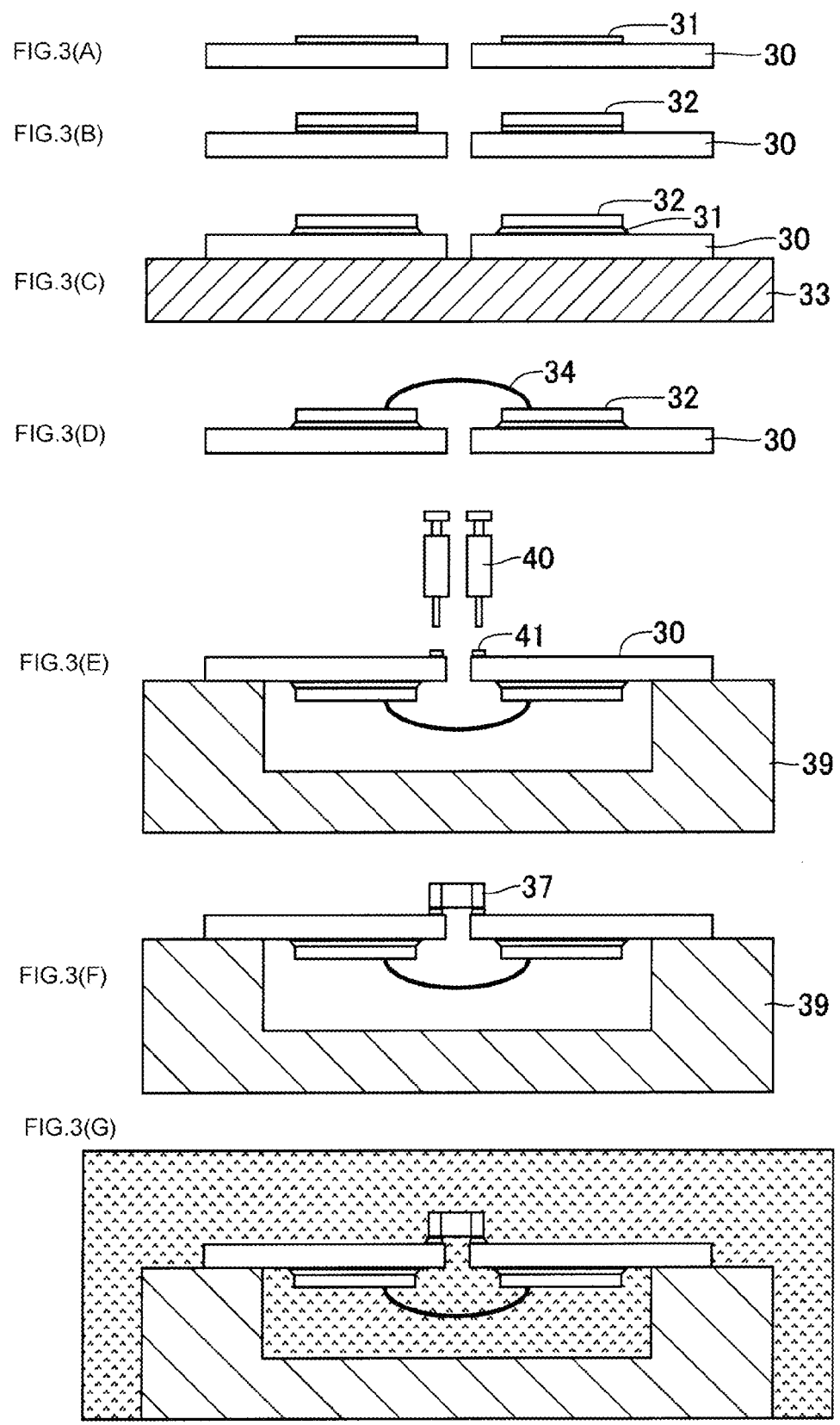

METHOD OF MANUFACTURING SEMICONDUCTOR APPARATUS, THE SEMICONDUCTOR APPARATUS, AND IGNITOR USING THE SEMICONDUCTOR APPARATUS

BACKGROUND OF THE INVENTION

A. Field of the Invention

The present invention relates to semiconductor apparatuses, and methods of manufacturing semiconductor apparatuses, and, in particular, semiconductor apparatuses such as power semiconductor devices.

B. Description of Related Art

The ignition coil for igniting an engine, for example, on an automobile, is provided with an ignitor. In the ignitor, a power semiconductor device is used. The power semiconductor device makes a current flow through a primary coil in the ignition coil and interrupts the current flowing through the primary coil to electronically control the ignition timing.

In a conventional ignitor, a hybrid integrated circuit ("IC") is used. The hybrid IC includes, for obtaining higher functions, a ceramic baseboard, electric circuits formed on the ceramic baseboard by sintering an electrically conductive material, and electronic parts such as an IC and a capacitor mounted on the electric circuits. In the other conventional ignitor disclosed in Japanese Unexamined Patent Application Publication No. 2009-129952 (also referred to herein as "Patent Document 1") a lead frame is divided into electrical wiring circuit sections, power semiconductor devices are mounted on the respective wiring circuit sections, and electronic parts are mounted on the wiring circuit sections such that the electronic part bridges the gap between the wiring circuit sections.

In the ignitor that employs a power semiconductor device such as an insulated-gate bipolar transistor (hereinafter referred to as an "IGBT"), it is necessary for the current path to exhibit a high heat capacity, since a high current flows through the IGBT, causing a high heating value. For meeting the demand for obtaining higher functions, it is necessary to mount many electronic parts on the ignitor package. However, if many electronic parts are mounted thereon while securing the required heat capacity, the ignitor package will be inevitably large in the external shape thereof. For solving the problem described above, Japanese Unexamined Patent Application Publication No. 2004-119676 (also referred to herein as "Patent Document 2") discloses a technique that mounts electronic parts on both surfaces of a lead frame to reduce the substantial area, on which the electronic parts are mounted.

The power semiconductor device includes a first main terminal bonded directly to the parts mounting surface of a wiring circuit section. The power semiconductor device further includes a second main terminal and a control terminal connected to separate wiring circuit sections with wires. Generally, the wirings are conducted by directly bonding, for example, an aluminum wire to copper, that is the lead frame material, by ultrasonic bonding. In the bonding, a copper-aluminum alloy layer is formed on the bonding plane of copper and aluminum. If exposed to a high temperature, the copper-aluminum alloy layer will grow, causing a brittle layer. Therefore, the copper-aluminum alloy layer will hardly endures the thermal stress caused by temperature change and will be fractured. For the general countermeasures against the fracture, a plating of a metallic material containing nickel (Ni) as the main component thereof (hereinafter referred to as a "nickel plating" or a "Ni-plating") is formed in advance in the area, in which the wire bonding to the lead frame will be conducted. The Ni-plating is formed to prevent defective bonding from causing in the bonding portion between the nickel wire and the copper lead frame.

Due to the manufacturing costs, the Ni-plating is formed not only in the area, in which the wire bonding to the lead frame is conducted, but also across the bonding areas in the direction, in which lead frames are arranged continuously, such that stripe-shaped Ni-plating films extend in parallel to each other. The Ni-plating described above poses the problems as described below.

Generally, the adhesiveness of the Ni-plating to the solder, the adhesiveness thereof to the electrically conductive adhesive, and the adhesiveness thereof to the mold resin are not so good. The area, in which the Ni-plating is formed, is used for the bonding area. However, the area, in which the Ni-plating is formed, is a useless area that can not be used for the area, to which electronic parts are bonded with a solder or with an electrically conductive adhesive. Therefore, the number of the electronic parts mountable on the lead frame will be limited.

Since the stripe-shaped plating should be formed so as not to cover the area, on which electronic parts are mounted, the number of the bonding areas with wires is also limited. Due to the poor adhesiveness of the Ni-plating to the mold resin, the difference between the thermal expansion coefficients of the mold resin and the lead frame exerts thermal stresses repeatedly to the wires in the heat cycle caused by the heat generation from the power semiconductor device, finally cutting the wires in the vicinity of the bonded portions thereof.

In the case in which electronic parts are mounted on both surfaces of the lead frame to prevent the package external shape from enlarging, the electronic parts may be displaced from the predetermined positions thereof, because it is necessary to tilt or turn over the lead frame in the manufacturing process. For preventing the electronic parts from being displaced from the predetermined positions thereof, the electronic parts on one lead frame surface are held temporarily with an insulating film or an insulating resin. Then, the other electronic parts are mounted on the other lead frame surface and connected to the other lead frame surface electrically by means of melting a solder and such a bonding material by the reflow technique and such a technique. The technique that holds the electronic parts temporarily on one lead frame surface is not applicable to the electronic parts which bridge the gap between the divided wiring circuit sections, since spaces are caused under the electronic parts and since it is impossible to stick any film thereto. Since the technique that holds the electronic parts temporarily with a resin causes many additional steps, the technique that holds the electronic parts temporarily with a resin is not applicable.

Accordingly, there is a need in the art for a method of manufacturing a semiconductor apparatus that facilitates mounting semiconductor devices and electronic parts on both surfaces of a lead frame divided to form wiring circuits without through complicated manufacturing steps.

SUMMARY OF THE INVENTION

Embodiments of the invention address these and other needs. In some embodiments, the semiconductor device and the electronic parts, mounted on the lead frame including a lead section and a wiring circuit section divided for forming a wiring circuit, are bonded to the lead frame with bonding materials, the bonding temperatures thereof are different from each other. In detail, on the first surface of the lead frame, the semiconductor device is bonded to the parts mounting plane of the wiring circuit section using a first bonding material and a first electronic part is bonded using the first bonding material such that the first electronic part bridges the gap between the wiring circuit sections.

A second electronic part can be bonded to the second surface of the lead frame using a second bonding material such that the second electronic part bridges the gap between the wiring circuit sections. Especially when the bonding temperature of the second bonding material is lower than the bonding temperature of the first bonding material, the bonding method employed on the first surface of the lead frame may be employed on the second surface of the lead frame only by lowering the bonding temperature. Therefore, it becomes possible to mount parts on both surfaces of the lead frame without complicating the manufacturing steps.

Because the parts are mounted on both surfaces of a lead frame using two kinds of bonding materials, the bonding temperatures thereof are different from each other, in the semiconductor apparatus and the ignitor, the manufacturing method according to the invention is advantageous for mounting parts on both surfaces of a lead frame through the similar manufacturing steps.

By employing the similar bonding methods on the first and second surfaces of a lead frame, the manufacturing steps are not complicated, since it is unnecessary to temporarily hold parts in bonding the parts to the second surface. Therefore, it is possible to reduce the manufacturing costs of the semiconductor apparatus and the ignitor using the semiconductor apparatus.

Although plating films are formed in the areas other than the bonding areas for forming the areas, to which bonding wires are bonded, the lead frame area is narrowed and the semiconductor apparatus can be made to be a relatively small size, because it is possible to mounts parts on both surfaces of the lead frame.

BRIEF DESCRIPTIONS OF THE DRAWINGS

FIG. 3(A) is a first cross sectional view of a lead frame describing the step of coating a solder by the method of manufacturing a semiconductor apparatus according to a second embodiment of the invention;

FIG. 3(B) is a second cross sectional view of the lead frame describing the step of mounting a chip by the method of manufacturing the semiconductor apparatus according to the second embodiment;

FIG. 3(C) is a third cross sectional view of the lead frame describing the step of melting the solder by the method of manufacturing the semiconductor apparatus according to the second embodiment;

FIG. 3(D) is a fourth cross sectional view of the lead frame describing the step of bonding a wire by the method of manufacturing the semiconductor apparatus according to the second embodiment;

FIG. 3(E) is a fifth cross sectional view of the lead frame describing the step of coating an electrically conductive adhesive by the method of manufacturing the semiconductor apparatus according to the second embodiment;

FIG. 3(F) is a sixth cross sectional view of the lead frame describing the step of parts mounting by the method of manufacturing the semiconductor apparatus according to the second embodiment; and FIG. 3(G) is a seventh cross sectional view of the lead frame describing the step of melting the electrically conductive adhesive by the method of manufacturing the semiconductor apparatus according to the second embodiment.

DETAILED DESCRIPTION

Now the invention will be described in detail hereinafter with reference to the accompanied drawings which illustrate the preferred embodiments of the invention.

Figure 1:
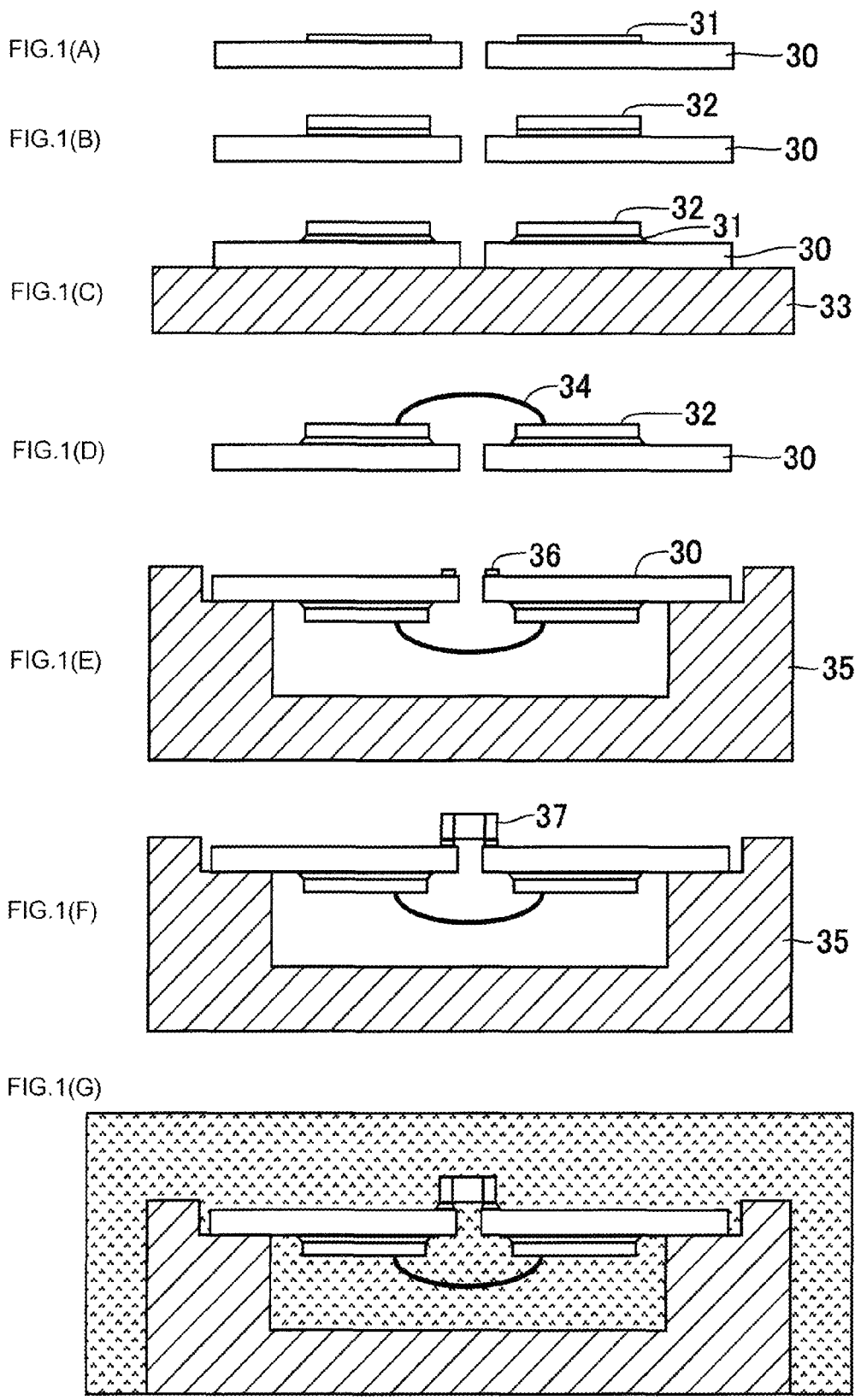
FIG. 1(A) is a first cross sectional view of a lead frame describing the step of coating a first solder by the method of manufacturing a semiconductor apparatus according to a first embodiment of the invention.
FIG. 1(B) is a second cross sectional view of the lead frame describing the step of mounting a chip by the method of manufacturing the semiconductor apparatus according to the first embodiment.
FIG. 1(C) is a third cross sectional view of the lead frame describing the step of melting the first solder by the method of manufacturing the semiconductor apparatus according to the first embodiment.
FIG. 1(D) is a fourth cross sectional view of the lead frame describing the step of bonding a wire by the method of manufacturing the semiconductor apparatus according to the first embodiment.
FIG. 1(E) is a fifth cross sectional view of the lead frame describing the step of coating a second solder by the method of manufacturing the semiconductor apparatus according to the first embodiment.
FIG. 1(F) is a sixth cross sectional view of the lead frame describing the step of parts mounting by the method of manufacturing the semiconductor apparatus according to the first embodiment.
FIG. 1(G) is a seventh cross sectional view of the lead frame describing the step of melting the second solder by the method of manufacturing the semiconductor apparatus according to the first embodiment.

FIG. 1(A) is a first cross sectional view of a lead frame describing the step of coating a first solder by the method of manufacturing a semiconductor apparatus according to a first embodiment of the invention. FIG. 1(B) is a second cross sectional view of the lead frame describing the step of mounting a chip by the method of manufacturing the semiconductor apparatus according to the first embodiment. FIG. 1(C) is a third cross sectional view of the lead frame describing the step of melting the first solder by the method of manufacturing the semiconductor apparatus according to the first embodiment. FIG. 1(D) is a fourth cross sectional view of the lead frame describing the step of bonding a wire by the method of manufacturing the semiconductor apparatus according to the first embodiment. FIG. 1(E) is a fifth cross sectional view of the lead frame describing the step of coating a second solder by the method of manufacturing the semiconductor apparatus according to the first embodiment. FIG. 1(F) is a sixth cross sectional view of the lead frame describing the step of parts mounting by the method of manufacturing the semiconductor apparatus according to the first embodiment. FIG. 1(G) is a seventh cross sectional view of the lead frame describing the step of melting the second solder by the method of manufacturing the semiconductor apparatus according to the first embodiment.

Figure 2:
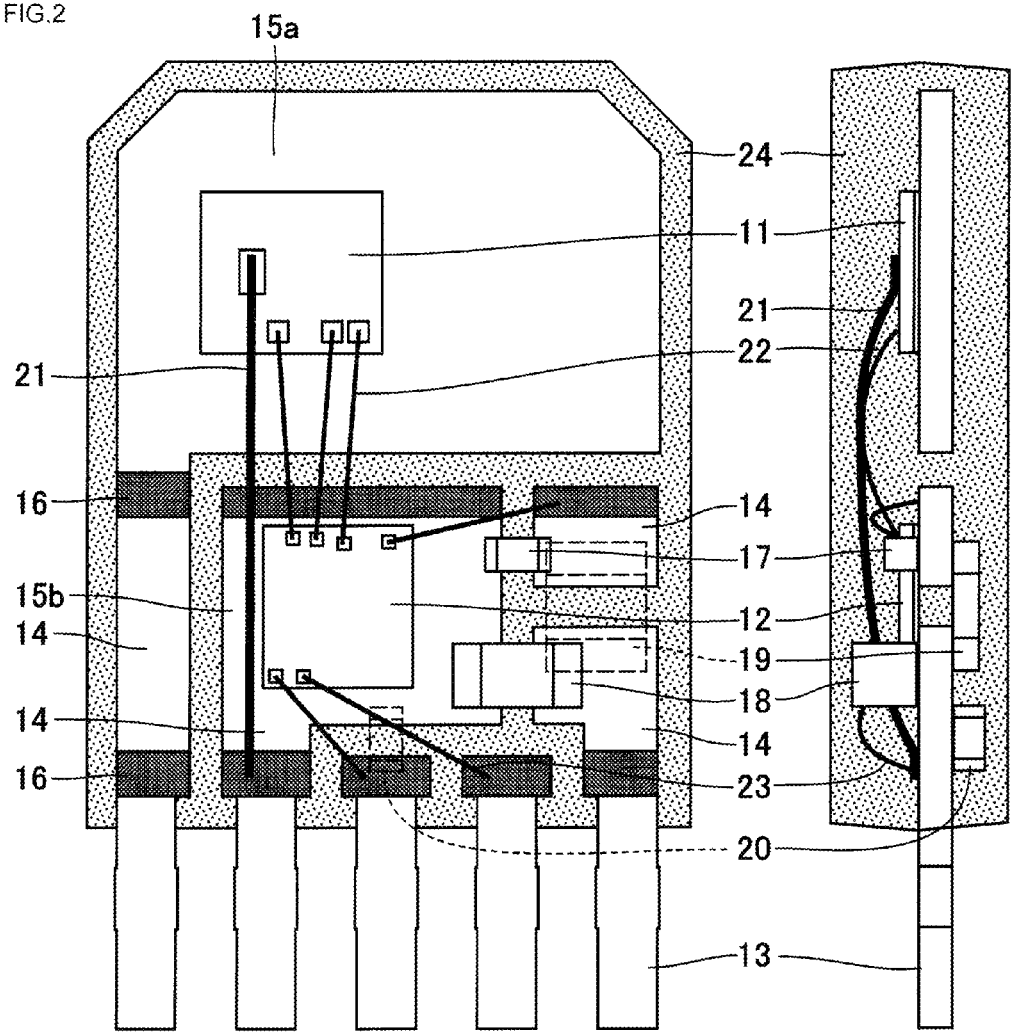
FIG. 2 is the cross sectional views of the semiconductor apparatus manufactured by the method according the first embodiment of the invention.

FIG. 2 is the cross sectional views of the semiconductor apparatus manufactured by the method according the first embodiment of the invention.

Referring at first to FIG. 2, the semiconductor apparatus according to the invention includes power semiconductor device 11 and control IC 12 that controls power semiconductor device 11. Power semiconductor device 11 is an ignitor used for driving the primary coil in an ignition coil. An IGBT exhibiting an excellent high L-load withstanding capability and an excellent high surge withstanding capability required of the ignitor is used for power semiconductor device 11.

The lead frame is formed by machining a copper plate. The lead frame includes lead sections 13 which form external connection terminals and wiring circuit sections 14 divided for forming wiring circuits. Some of wiring circuit sections 14 have a wide area such that parts mounting surfaces 15a and 15b, on which power semiconductor device 11 and IC 12 are mounted, respectively, are formed. In each divided wiring circuit section 14, two Ni-plating sections 16, each shaped with a stripe, are illustrated exemplary to form bonding areas. Since plating sections 16 are formed linearly in the direction, in which lead frames are arranged continuously, some plating sections 16 may be formed in the areas which are not the bonding area.

On the side of the lead frame, on which power semiconductor device 11 and IC 12 are mounted, electronic parts (first electronic parts) 17 and 18 are mounted such that first electronic parts 17 and 18 bridge the gaps between wiring circuit sections 14. On the other side of the lead frame, electronic parts (second electronic parts) 19 and 20 are mounted such that second electronic parts 19 and 20 bridge the gaps between wiring circuit sections 14. These electronic parts 17, 18, 19, and 20 may be a chip capacitor and a chip resistor, each in a surface mounting package.

Power semiconductor device 11 includes a main terminal connected with bonding wire 21 to plating section 16 formed in wring circuit section 14 in the vicinity of lead section 13 and control terminals connected with bonding wires 22 to the predetermined terminals of IC 12. The other terminals of IC 12 are connected with bonding wires 23 to plating sections 16.

The lead frame, which mounts power semiconductor device 11, IC 12, first electronic parts 17, 18, and second electronic parts 19, 20 thereon, is sealed collectively with mold resin 24 for a packaging material.

Now the method of manufacturing the semiconductor apparatus according to the first embodiment of the invention will be described below with reference to FIGS. 1(A) through 1(G).

Referring now to FIG. 1(A), first solder 31 is coated on the upper surface of wiring circuit section 14 on lead frame 30. In detail, a solder paste is printed on the areas, to which power semiconductor device 11, IC 12, and electronic parts 17 and 18 are bonded. Solder 31 is prepared such that the melting point thereof is around 230° C.

It is preferable to employ solders, the melting points thereof are different, for solder 31 and solder 36 described later. In detail, it is preferable to employ a solder, the melting point thereof is higher than the melting point of solder 36 used in the late step, for solder 31 used in the preceding step.

Referring now to FIG. 1(B), power semiconductor device 11, IC 12, and electronic parts 17 and 18 are mounted on coated solder 31. (In FIG. 1(B), chip 32 of power semiconductor device 11 and IC 12 is shown.) The mounting of chip 32 on solder 31 is performed by a chip mounter. Then, lead frame 30 is transferred onto hot plate (first heater) 33 and mounted on hot plate 33.

Then, the heating temperature of hot plate 33 is adjusted and chip 32 is bonded with solder 31 to lead frame 30 by the reflow technique as shown in FIG. 1(C). In detail, hot plate 33 is heated initially at a preheating temperature and lead frame 30 preheats solder 31 and chip 32. Then, hot plate 33 is heated at a temperature higher than the solder 31 melting point to melt solder 31. Solder 31 is melted for a short time and, then, cooled to finish the soldering of chip 32.

Then, the wiring with bonding wire 34 is conducted as shown in FIG. 1(D). The wiring is conducted by bonding wire 34 to the pad of chip 32 such as power semiconductor device 11 and IC 12 and to lead section 13 or wiring circuit section 14. The wiring is conducted also by bonding wire 34 to the pads of chips 32. The bonding of wire 34 to lead section 13 and wiring circuit section 14 is conducted via plating sections 16 formed on lead section 13 and wiring circuit section 14.

Lead frame 30, on which the wiring with bonding wire 34 is conducted, is turned upside down, mounted on heating cradle (second heater) 35 as shown in FIG. 1(E), and second solder 36 is coated on wiring circuit sections 14 of lead frame 30. The melting point of second solder 36 is lower than the melting point of first solder 31. A lead reflow solder, the melting point of which is around 200° C., for example, is used for second solder 36. Second solder 36 is coated on the wiring circuit section 14 area, to which an electronic part is bonded. Heating cradle 35 is shaped with a concavity so that chip 32 and bonding wire 34 may not come in contact with heating cradle 35, when lead frame 30 is mounted thereon. Heating cradle 35 supports lead frame 30 in the areas except the areas, on which chip 32 and bonding wire 34 are mounted.

Then, electronic parts 37 such as electronic parts 19 and 20 are mounted on second solder 36 coated on wiring circuit sections 14 such that electronic parts 37 bridge the gaps between divided wiring circuit sections 14 as shown in FIG. 1(F).

In the subsequent step of melting the second solder, the heating temperature of heating cradle 35 is adjusted, second solder 36 is melted by conducting the heat via lead frame 30, and electronic parts 37 are soldered to lead frame 30. Preferably, lead frame 30 supported by heating cradle 35 is put in a high-temperature furnace as shown in FIG. 1(G), the ambient temperature of lead frame 30 is raised in the preheating and in the heating, and, then, the ambient temperature of lead frame 30 is lowered in cooling lead frame 30.

After chip 32 and electronic parts 37 are soldered to the respective surfaces of lead frame 30, the lead frame 30 surfaces are sealed with a mold resin, resulting in a semiconductor apparatus.

In a method of manufacturing a semiconductor apparatus according to the first embodiment, the second soldering is conducted employing both the heating in a high-temperature environment and the heating by heating cradle 35. Alternatively, the second soldering may be conducted employing the heating in a high-temperature environment or the heating by heating cradle 35 with no problem.

In the above described working example, a solder paste is employed. If the flux generated in the step of melting the solder affects the subsequent steps adversely, it will be preferable to add a step of cleaning the flux, if necessary.

FIG. 3(A) is a first cross sectional view of a lead frame describing the step of coating a solder by the method of manufacturing a semiconductor apparatus according to a second embodiment of the invention. FIG. 3(B) is a second cross sectional view of the lead frame describing the step of mounting a chip by the method of manufacturing the semiconductor apparatus according to the second embodiment. FIG. 3(C) is a third cross sectional view of the lead frame describing the step of melting the solder by the method of manufacturing the semiconductor apparatus according to the second embodiment. FIG. 3(D) is a fourth cross sectional view of the lead frame describing the step of bonding a wire by the method of manufacturing the semiconductor apparatus according to the second embodiment. FIG. 3(E) is a fifth cross sectional view of the lead frame describing the step of coating an electrically conductive adhesive by the method of manufacturing the semiconductor apparatus according to the second embodiment. FIG. 3(F) is a sixth cross sectional view of the lead frame describing the step of parts mounting by the method of manufacturing the semiconductor apparatus according to the second embodiment. FIG. 3(G) is a seventh cross sectional view of the lead frame describing the step of melting the electrically conductive adhesive by the method of manufacturing the semiconductor apparatus according to the second embodiment.

In FIGS. 3(A) through 3(G), the same reference numerals as used in FIGS. 1(A) through 1(G) are used to designate the same constituent elements and their duplicated description are omitted for the sake of simplicity.

In the method of manufacturing a semiconductor apparatus according to the second embodiment, solder 31 is coated on the lead frame 30 areas, to which power semiconductor device 11, IC 12, and electronic parts 17 and 18 are bonded, as shown in FIG. 3(A).

Then, chip 32 is mounted on coated solder 31 as shown in FIG. 3(B). Then, lead frame 30 with chip 32 mounted thereon is transferred to hot plate 33 and placed thereon.

Then, the heating temperature of hot plate 33 is adjusted, solder 31 is melted, and chip 32 is soldered to lead frame 30 as shown in FIG. 3(C).

Then, the wiring with bonding wire 34 is conducted between chips 32, between chip 32 and lead section 13, and between chip 32 and wiring circuit section 14. as shown in FIG. 3(D).

Lead frame 30, on which the wiring with bonding wire 34 is conducted, is turned upside down, mounted on cradle 39 as shown in FIG. 3(E). Cradle 39 is shaped with a concavity so that chip 32 and bonding wire 34 may not come in contact with cradle 39, when lead frame 30 is mounted thereon. Cradle 39 supports lead frame 30 in the areas except the areas, on which chip 32 and bonding wire 34 are mounted.

Then, thermosetting electrically conductive adhesive 41, the setting temperature of which is lower than the solder 31 melting point, is coated by dispenser 40 on the lead frame 30 areas, to which electronic parts are bonded. When the melting point of solder 31 is 240° C., thermosetting electrically conductive adhesive 41, the setting temperature of which is around 150° C., is employed.

Then, electronic parts 37 such as electronic parts 19 and 20 are mounted on thermosetting electrically conductive adhesive 41 coated on wiring circuit sections 14 such that electronic parts 37 bridge the gaps between divided wiring circuit sections 14 as shown in FIG. 3(F).

Then, lead frame 30, mounting electronic parts 37 on thermosetting electrically conductive adhesive 41 coated thereon and mounted on cradle 39, is put in a high-temperature furnace as shown in FIG. 3(G) to set thermosetting electrically conductive adhesive 41. The temperatures of the high-temperature furnace are adjusted to be suitable for the preheating, heating and cooling. Especially for the heating, the ambient temperature is set at the setting temperature of thermosetting electrically conductive adhesive 41. By employing thermosetting electrically conductive adhesive 41 for the bonding material of electronic parts 37, it is possible to mount parts on both surfaces of lead frame 30 without complicating the manufacturing steps so much.

After chip 32 and electronic parts 37 are mounted on the respective surfaces of lead frame 30, the lead frame 30 surfaces are sealed with a mold resin, resulting in a semiconductor apparatus.

The manufacturing methods according to the invention are well sited for manufacturing an ignitor, since the parts are mounted on both surfaces of a lead frame using two kinds of bonding materials, the bonding temperatures thereof are different from each other, in the ignitor. The semiconductor apparatus according to the invention is used preferably for an ignitor.

Examples of specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the above description, specific details are set forth in order to provide a thorough understanding of embodiments of the invention. Embodiments of the invention may be practiced without some or all of these specific details. Further, portions of different embodiments and/or drawings can be combined, as would be understood by one of skill in the art.

This application is based on, and claims priority to, Japanese Patent Application No. 2011-003893, filed on Jan. 12, 2011. The disclosure of the priority application, in its entirety, including the drawings, claims, and the specification thereof, is incorporated herein by reference.

What is claimed is:

1. A method of manufacturing a semiconductor apparatus, the method comprising the steps of:

making a first surface of a lead frame, comprising a lead section and a wiring circuit section divided for forming a wiring circuit, face upward;

bonding a semiconductor device to a parts mounting plane of the wiring circuit section using a first bonding material;

bonding a first electronic part using the first bonding material for bridging a gap between the wiring circuit sections;

connecting the semiconductor device and the wiring circuit section with a bonding wire;

turning upside down the lead frame for making a second surface of the lead frame face upward;

bonding a second electronic part to the second surface of the lead frame using a second bonding material at a temperature lower than a temperature that the first electronic part is bonded, for bridging the gap between wiring circuit sections;

and sealing both sides of the lead frame with a mold resin.

2. The method according to claim 1, wherein the first bonding material comprises a first solder, which is heated with a first heater brought into contact with the second surface of the lead frame at a temperature higher than a melting point of the first solder for bonding the semiconductor device and the first electronic part to the first surface of the lead frame;

and the second bonding material comprises a second solder, a melting point thereof being lower than the melting point of the first solder, and the second solder is heated with a second heater brought into contact with areas in the first surface of the lead frame other than the areas, on which the semiconductor device and the first electronic part are mounted, at a temperature lower than the melting point of the first solder but higher than the melting point of the second solder for bonding the second electronic part to the second surface of the lead frame.

3. The method according to claim 2, wherein
the lead frame, with which the second heater is brought into contact, is placed in a high-temperature furnace in the bonding using the second solder for setting an ambient temperature to be high in the heating with the second heater.

4. The method according to claim 1, wherein
the first bonding material comprises a solder, which is heated with a heater brought into contact with the second surface of the lead frame at a temperature higher than a melting point of the solder for bonding the semiconductor device and the first electronic part to the first surface of the lead frame;
and
the second bonding material comprises a thermosetting electrically conductive adhesive, which is heated at an ambient temperature lower than the melting point of the solder for bonding the second electronic part to the second surface of the lead frame.

5. A semiconductor apparatus comprising:
a lead frame comprising a lead section and a wiring circuit section divided for forming a wiring circuit;
a semiconductor device on a first surface of the lead frame, the semiconductor device being bonded to a parts mounting plane of the wiring circuit section using a first bonding material, the semiconductor device being connected to the wiring circuit section with a bonding wire;
a first electronic part bonded to the first surface of the lead frame using the first bonding material for bridging a gap between the wiring circuit sections;
and
a second electronic part bonded to a second surface of the lead frame using a second bonding material capable of bonding at a temperature lower than that of the first bonding material for bridging the gap between the wiring circuit sections.

6. An ignitor comprising:
a lead frame comprising a lead section and a wiring circuit section divided for forming a wiring circuit;
a power semiconductor device on a first surface of the lead frame, the power semiconductor device being bonded to a parts mounting plane of the wiring circuit section using a first bonding material, the power semiconductor device being connected to the wiring circuit section with a bonding wire;
an IC that controls the power semiconductor device, the IC being on the first surface of the lead frame, the IC being bonded to the parts mounting plane of the wiring circuit section using the first bonding material, the IC being connected to the wiring circuit section with a bonding wire;
a first electronic part bonded to the first surface of the lead frame using the first bonding material for bridging a gap between the wiring circuit sections;
and
a second electronic part bonded to a second surface of the lead frame using a second bonding material capable of bonding at a temperature lower than that of the first bonding material for bridging the gap between the wiring circuit sections.

7. A method of manufacturing a semiconductor apparatus, the method comprising the steps of:
making a first surface of a lead frame, comprising a lead section and a wiring circuit section divided for forming a wiring circuit, facing in a first direction;
bonding a semiconductor device to a parts mounting plane of the wiring circuit section using a first bonding material;
bonding a first electronic part using the first bonding material for bridging a gap between the wiring circuit sections;
connecting the semiconductor device and the wiring circuit section with a bonding wire;
turning the lead frame for making a second surface of the lead frame face in the first direction;
bonding a second electronic part to the second surface of the lead frame using a second bonding material at a temperature lower than a temperature that the first electronic part is bonded, for bridging the gap between wiring circuit sections;
and
sealing both sides of the lead frame with a mold resin.

* * * * *